United States Patent [19]
Hirata

[11] Patent Number: 5,811,866
[45] Date of Patent: Sep. 22, 1998

[54] ACTIVE-MATRIX BOARD HAVING TOP AND BOTTOM LIGHT SHIELDING FILMS

[75] Inventor: Kazumi Hirata, Tokyo, Japan

[73] Assignee: NEC Corporation, Tokyo, Japan

[21] Appl. No.: 713,968

[22] Filed: Sep. 12, 1996

[30] Foreign Application Priority Data

Sep. 12, 1995 [JP] Japan ................................. 7-233748

[51] Int. Cl.⁶ ............................................. H01L 31/0232
[52] U.S. Cl. ........................... 257/435; 257/294; 349/44; 349/110
[58] Field of Search .............................. 257/59, 72, 294, 257/435; 349/41, 42, 44, 110

[56] References Cited

U.S. PATENT DOCUMENTS 5,377,031  12/1994  Vu et al. .................................... 349/45

FOREIGN PATENT DOCUMENTS

| | | |
|---|---|---|
| 2-39129 | 2/1990 | Japan . |
| 3-12635 | 1/1991 | Japan . |
| 4-225328 | 8/1992 | Japan . |
| 4-237027 | 8/1992 | Japan . |

Primary Examiner—Minh-Loan Tran
Attorney, Agent, or Firm—Young & Thompson

[57] ABSTRACT

An active-matrix board has a first light shield film disposed on a face side of a thin-film transistor, for blocking light applied toward the thin-film transistor, and a second light shield film disposed on a reverse side of the transparent insulating substrate and positioned across the transparent insulating substrate from the first light shield film, for blocking light applied toward the thin-film transistor. Light applied to both the sides of transparent insulating substrate is prevented from reaching the thin-film transistor by the first and second light shield films. An increase in an OFF current generated by the thin-film transistor due to light excitation is eliminated for thereby preventing the contrast of a displayed image from being lowered.

21 Claims, 3 Drawing Sheets

ACTIVE-MATRIX BOARD HAVING TOP AND BOTTOM LIGHT SHIELDING FILMS

BACKGROUND OF THE INVENTION

1. Field of the Invention

The present invention relates to an active-matrix board for use in a liquid display unit and a method of manufacturing such an active-matrix board, and more particularly to the prevention of characteristic deteriorations of thin-film transistors of such an active-matrix board due to the application of light thereto.

2. Description of the Related Art

In recent years, there have been developed various display devices comprising liquid-crystal panels for use as wall-hanging TV display units, projection-type TV display units, and OA (office automation) device display units. Among such liquid-crystal panels is an active-matrix liquid-crystal panel having thin-film transistors as active elements in a liquid-crystal display device. Since the active-matrix liquid-crystal panel is advantageous in that the contrast and the speed of response are not lowered even with an increased number of scanning lines, it is useful when applied to OA device display units of high image quality and display units for high-definition image display. The active-matrix liquid-crystal panel is also effective to produce a large display screen size when incorporated in a projection-type liquid-crystal display device.

The active-matrix liquid-crystal panel is subject to intensive light applied thereto during usage. Upon exposure to such intensive light, thin-film transistors fabricated on an active matrix board of the active-matrix liquid-crystal panel produce an increased OFF current owing to light excitation, resulting in a reduction of the contrast of a displayed image.

To prevent thin-film transistors characteristics from being lowered due to the application of light, there has been proposed to use a light shield film for restricting the application of light as disclosed in Japanese laid-open patent publication No. 2-39129, for example.

FIGS. 1(a) and 1(b) of the accompanying drawings shows in cross section such a conventional active-matrix board having a light shield film.

A process of manufacturing the conventional active-matrix board will be described below with reference to FIGS. 1(a) and 1(b).

As shown in FIG. 1(a), a thin-film transistor 102 is formed on a transparent insulating substrate 101, and an ITO (indium tin oxide) film 103 is patterned as a signal line on the thin-film transistor 102 and a pixel region of the transparent insulating substrate 101 outside of the thin-film transistor 102. Thereafter, only a portion of the patterned ITO film 103 which is positioned on the pixel region is covered with an aluminum film 106.

Then, the assembly is processed in a hydrogen plasma, reducing and devitrifying the ITO film 103 patterned on the thin-film transistor 102 thereby to produce a light shield film 107. Thereafter, the aluminum film 106 is patterned by photoetching, forming a source electrode 104 and a train electrode 104 (see FIG. 1(b)).

With the active-matrix board thus manufactured, light applied from above the thin-film transistor 102 is blocked by the light shield-film 107 and does not reach the thin-film transistor 102.

FIG. 2 of the accompanying drawings shows in cross section another conventional active-matrix board having a light shield film.

As shown in FIG. 2, an ITO film 203 is patterned on a transparent insulating substrate 201, and an $SiO_2$ film 205 is deposited on the ITO film 203. Then, a thin-film transistor 202 is formed on the $SiO_2$ film 205, and a protective film 212 of plasma SiH:H is patterned on the thin-film transistor 202. Thereafter, the assembly is heated to a temperature of 350° C. or higher, causing hydrogen to be discharged from the protective film 212. The ITO film 203 underneath the protective film 212 is now reduced and devitrified into a light shield film 207.

With the active-matrix board shown in FIG. 2, light applied from the side of the transparent insulating substrate 201 is blocked by the light shield film 207 and does not reach the thin-film transistor 202.

In the conventional active-matrix boards shown in FIGS. 1 and 2, the light shield film is positioned on one side of the thin-film transistor, i.e., close to or remote from the transparent insulating substrate. Consequently, the light shield film is incapable of blocking light applied from the side there no light shield film is located.

FIG. 3 of the accompanying drawings shows light blocking operation of the conventional active-matrix board shown in FIGS. 1(a) and 1(b) where the light shield film 107 is disposed on the thin-film transistor 102.

As shown in FIG. 3, incident light 121 applied from the side of the light shield film 107 is blocked by the light shield film 107, and does not reach the thin-film transistor 102.

Light 122 that has passed through a light-crystal display device 120 which incorporates the active-matrix board is reflected as reflected light 123 by a surface of a lens 125 of an optical system associated with the light-crystal display device 120 and positioned on the reverse side of the active-matrix board. Therefore, the reflected light 123 is applied to the thin-film transistor 102 from the reverse side of the active-matrix board.

Accordingly, an OFF current generated by the thin-film transistor 102 due to light excitation is increased, causing a reduction of the contrast of a displayed image.

For patterning the aluminum film 106 before the light shield film 107 is formed, there are required two patterning steps, i.e., the step of exposing the ITO film 103 only on the thin-film transistor 102 for the hydrogen plasma processing, and the step of removing the aluminum film 106 from above the ITO film 103 in the pixel region and simultaneously forming the drain electrode 105. Therefore, the number of steps required is increased.

With the active-matrix board shown in FIG. 2, since incident light is applied from the side of the transparent insulating substrate 201, the incident light is prevented from reaching the thin-film transistor 202 by the light shield film 207. However, light that has passed through a liquid-crystal display device incorporating the active-matrix board is reflected by a surface of a lens of an optical system associated with the liquid-crystal display device, and applied to the thin-film transistor 202 from the side where no light shield film is provided.

Another problem of the active-matrix board shown in FIG. 2 is that the ITO film 203 which serves as the light shield film 207 produces a surface step which is likely to cause a breakage of interconnection patterns and irregularities of the gap between the active-matrix board and a confronting board which are to be bonded to each other.

The light shield film 207 shown in FIG. 2 may be replaced with a silicon film formed below the thin-film transistor 202. However, because the overall structure remains the same, it is impossible to prevent reflected light from reaching the thin-film transistor 202. Since the silicon film has its light transmittance increased as its film thickness increases, if the film thickness of the silicon film is reduced, then it cannot fully block light, and if the film thickness of the silicon film is increased for a greater light blocking capability, then it produces a larger surface step.

SUMMARY OF THE INVENTION

It is therefore an object of the present invention to provide an active-matrix board which is capable of eliminating an increase in an OFF current generated by a thin-film transistor due to light excitation for thereby preventing the contrast of a displayed image from being lowered, and a method of manufacturing such an active-matrix board.

To achieve the above object, there is provided in accordance with the present invention an active-matrix board comprising:

a transparent insulating substrate with scanning and signal lines thereon;

a thin-film transistor disposed on a face side of the transparent insulating substrate;

a first light shield film disposed on the thinfilm transistor, for blocking light applied toward the thin-film transistor; and a second light shield film disposed on a reverse side of the transparent insulating substrate and positioned across the transparent insulating substrate from the first light shield film, for blocking light applied toward the thin-film transistor;

the reverse side of the transparent insulating substrate having a roughened surface where the second light shield film is disposed.

According to the present invention, there is also provided an active-matrix board comprising:

a transparent insulating substrate with scanning and signal lines thereon;

a thin-film transistor disposed on a face side of the transparent insulating substrate;

a first light shield film disposed on the thin-film transistor, for blocking light applied toward the thin-film transistor; and a second light shield film disposed on a reverse side of the transparent insulating substrate and positioned across the transparent insulating substrate from the first light shield film, for blocking light applied toward the thin-film transistor;

the transparent insulating substrate having an opaque portion where the second light shield film is disposed.

In the former active-matrix board, the roughened surface may be opaque. In both of the active-matrix boards, each of the first light shield film and the second light shield film may be made of aluminum, and the thin-film transistor may comprise a planar thin-film transistor or a staggered thin-film transistor.

According to the present invention, there is also provided a method of manufacturing an active-matrix board having first and second light shield films of metal disposed respectively on face and reverse sides of a transparent insulating substrate with a thin-film transistor disposed thereon, for preventing light from being applied to the thin-film transistor, the method comprising the steps of:

patterning a signal line connected to a drain electrode of the thin-film transistor;

forming a first film of metal on a face side of the transparent insulating substrate and the thin-film transistor;

removing the first film of metal by photoetching except a first portion thereof disposed on the thin-film transistor, thereby leaving the first portion as a first light shield film on the thin-film transistor;

forming a photoresist layer on a portion of a reverse side of the transparent insulating-substrate out of alignment with the first light shield film;

processing a portion of the reverse side of the transparent insulating substrate in alignment with the first light shield film into a roughened surface by way of a hydrogen plasma process;

forming a second film of metal on the reverse side of the transparent insulating substrate and the photoresist layer; and removing the second film of metal by lift-off except a second portion thereof disposed on the roughened surface, thereby leaving the second portion as a second light shield film on the roughened surface.

In the above method, the roughened surface may be opaque, each of the first light shield film and the second light shield film may be made of aluminum, and the thin-film transistor may comprise a planar thin-film transistor or a staggered thin-film transistor.

With the above arrangement, since the first light shield film is disposed on the thin-film transistor on the face side of the transparent insulating film, and the second light shield film is disposed on the reverse side of the transparent insulating substrate and positioned across the transparent insulating substrate from the first light shield film, the thin-film transistor is sandwiched between the first and second light shield films. Light applied to the both sides of the transparent insulating substrate is blocked by the first and second light shield films, and does not reach the thin-film transistor.

Because the portion of the reverse side of the transparent insulating substrate where the second light shield film is disposed comprises the roughened surface, light which may have entered the transparent insulating substrate is attenuated by diffused reflection, and does not reach the thin-film transistor.

The above and other objects, features, and advantages of the present invention will become apparent from the following description with reference to the accompanying drawings which illustrate an example of the present invention.

DETAILED DESCRIPTION OF THE PREFERRED EMBODIMENT

A process of manufacturing an active-matrix board according to the present invention will be described below with reference to FIGS. 4(*a*) through 4(*e*).

Figure 4A:
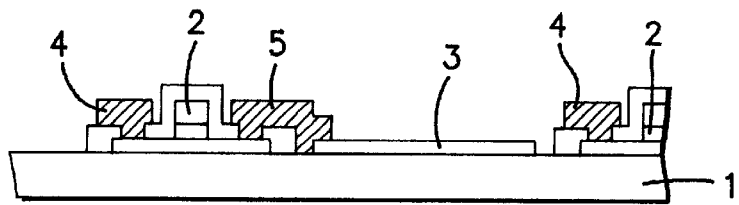
FIGS. 4(*a*) through 4(*e*) are cross-sectional views showing a process of manufacturing an active-matrix board according to the present invention.

As shown in FIG. 4(a), thin-film transistors 2 are formed on a transparent insulating film 1, and source electrodes 4 and drain electrodes 5 are formed on the thin-film transistors 2. An ITO film 3 serving as a signal line is patterned in a pixel region so as to be connected to each of the drain electrodes 5.

Figure 4B:
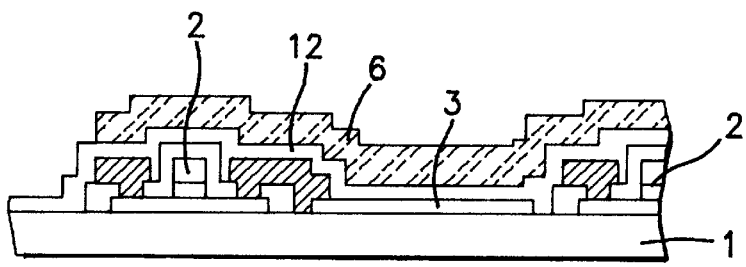

Then, as shown in FIG. 4(b), an SiO2 film 12 and an aluminum film 6 which is a first metal film are deposited each to a thickness of 100 nm on the surface formed so far.

Figure 4C:
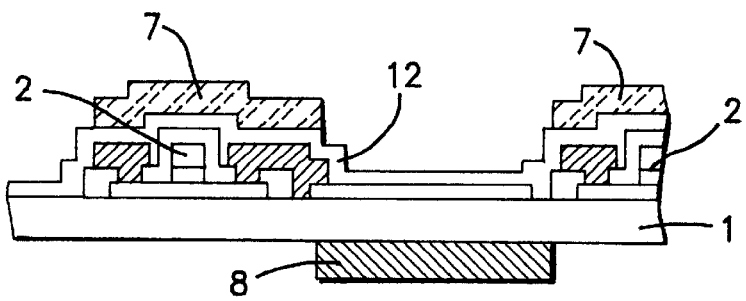

Then, as shown in FIG. 4(c), a portion of the aluminum film 6 which is deposited outside of the thin-film transistors 2 is removed in its entirety by photoetching, forming a first light shield film 7 which comprises the aluminum film 6 deposited on the thin-film transistors 2. A negative photoresist is coated on the reverse side of the transparent insulating film 1. Thereafter, the transparent insulating film 1 is exposed to light from the side where the thin-film transistors 2 are disposed, and then developed to produce a photoresist layer 8 on the reverse side of the transparent insulating film 1.

Figure 4D:
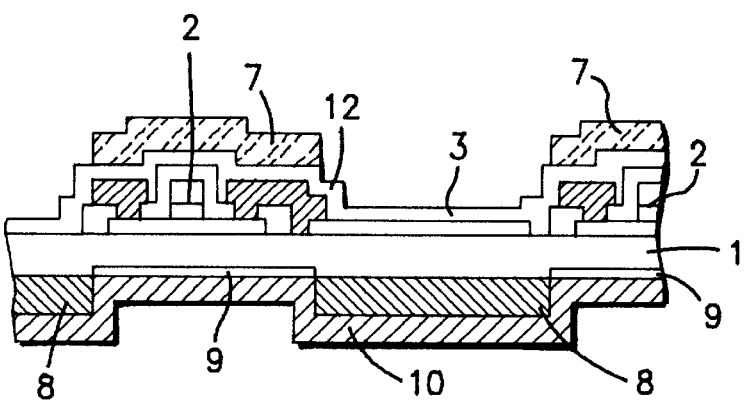

Then, as shown in FIG. 4(d), the assembly is heated in a hydrogen plasma atmosphere to process a portion of the reverse side of the transparent insulating film 1 outside of the photoresist layer 8 into a roughened surface 9. An aluminum film 10 serving as a second metal film is deposited on the entire reverse side of the transparent insulating film 1.

Figure 4E:
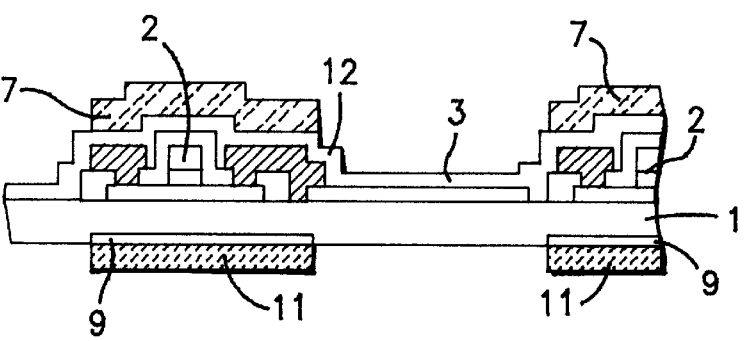

Subsequently, as shown in FIG. 4(e), the photoresist layer 8 and the aluminum film 10 deposited thereon are removed by a lift-off process, leaving the aluminum film 10 only on the roughened surface 9. The aluminum film 10 that is left serves as a second light shield film 11.

Light blocking operation of the active-matrix board thus manufactured will be described below with reference to FIG. 5.

Figure 1A:
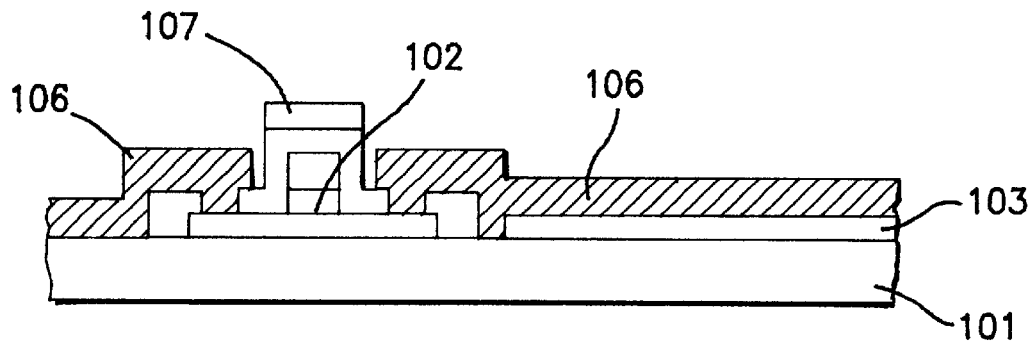
FIGS. 1(*a*) and 1(*b*) are cross-sectional views of a conventional active-matrix board having a light shield film.
Figure 1B:
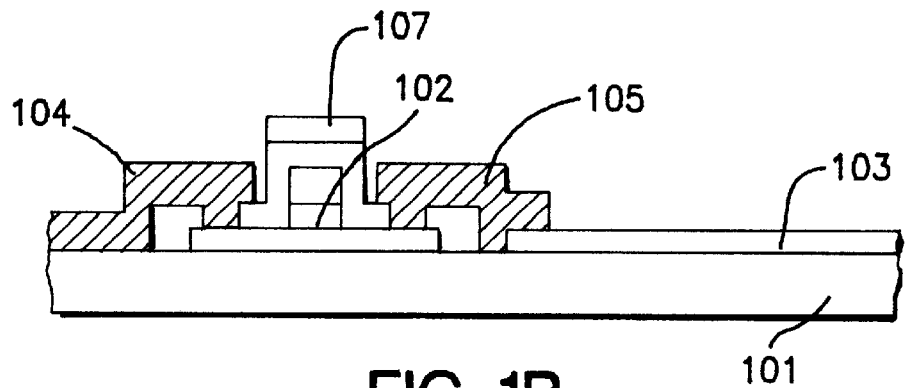
Figure 2:
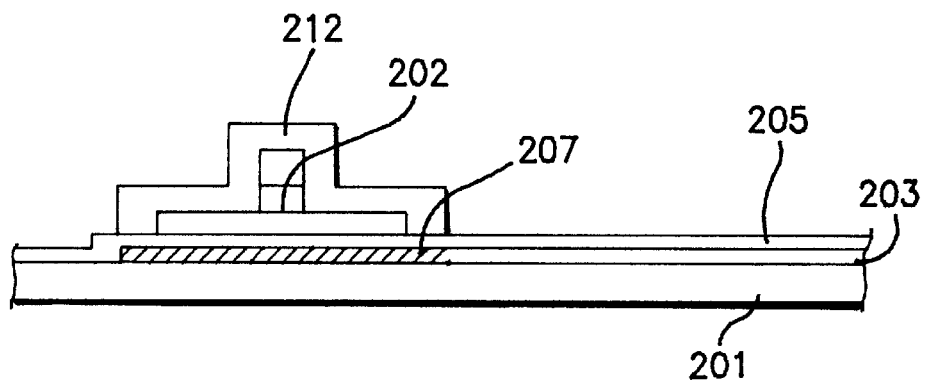
FIG. 2 is a cross-sectional view of another conventional active-matrix board having a light shield film.
Figure 3:
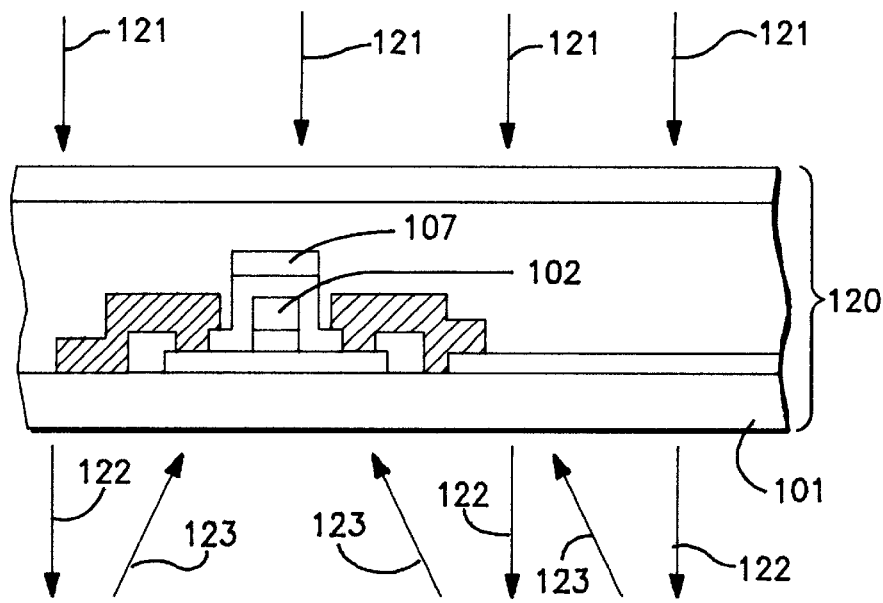
FIG. 3 is a cross-sectional view showing light blocking operation of the conventional active-matrix board shown in FIGS. 1(*a*) and 1(*b*) where a light shield film is disposed on a thin-film transistor.
Figure 5:
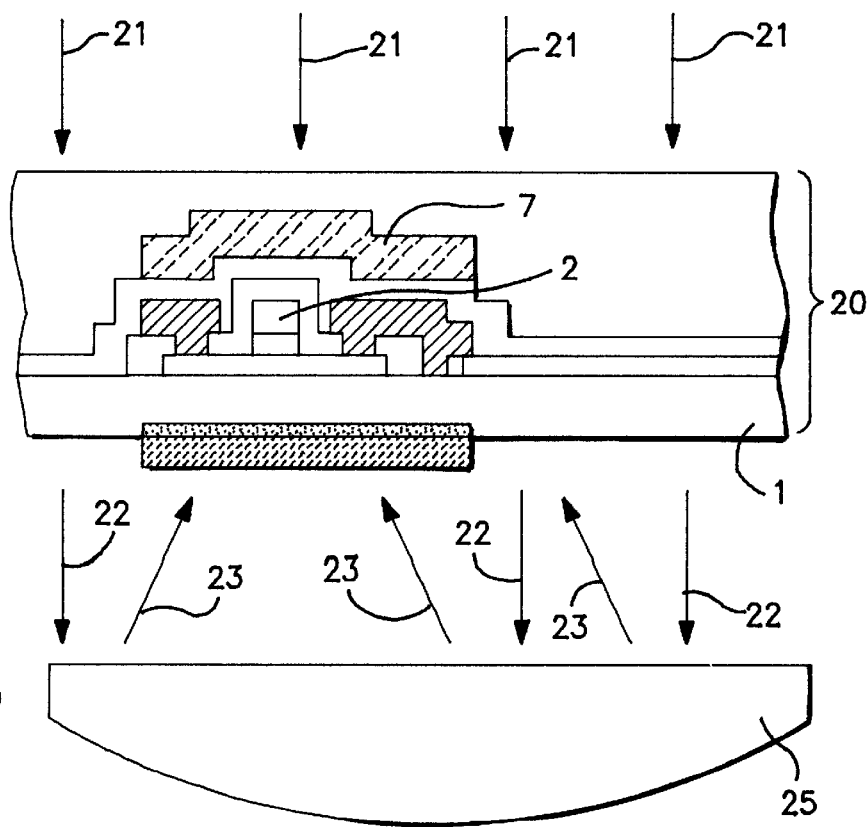
FIG. 5 is a cross-sectional view showing light blocking operation of the active-matrix board manufactured by the process shown in FIGS. 4(*a*) through 4(*e*).

As shown in FIG. 5, the first light shield film 7 is effective in preventing incident light 21, applied from above a light-crystal display device 20 which incorporates the active-matrix board, from reaching the thin-film transistor 2. The second light shield film 11 is effective in preventing reflected light 23, which is produced when the incident light 21 passes through the light-crystal display device 20 and is reflected by a surface of a lens 25 of an optical system associated with the light-crystal display device 20 and positioned on the reverse side of the light-crystal display device 20, from reaching the thin-film transistor 2.

Since the transparent insulating substrate 1 is present between the second light shield film 11 and the thin-film transistor 2, light may enter the transparent insulating substrate 1 by way of diffraction. However, inasmuch as the reverse side of the transparent insulating substrate 1 has the roughened surface 9 where the second light shield film 11 is positioned, the light which may have entered the transparent insulating substrate 1 by way of diffraction is attenuated by diffused reflection. As a result, an amount of light which is large enough to increase the OFF current of the thin-film transistor 2 does not reach the thin-film transistor 2.

Accordingly, the OFF current which is generated by the thin-film transistor 2 due to light excitation is prevented from increasing, and hence the quality of an image displayed by the light-crystal display device 20 is prevented from being lowered.

While the thin-film transistor 2 which is illustrated in the above embodiment is of the planar type, it may be of the staggered type or any of various other structures.

In the step shown in FIG. 4(c), a portion of the reverse side of the transparent insulating substrate 1 is processed into the roughened surface 9. However, a portion of the transparent insulating substrate 1 directly below the thin-film transistor 2 may also be devitrified.

Each of the first and second light shield films 7, 11 is made of aluminum in the above embodiment. However, each of the first and second light shield films 7, 11 may be made of any of various other metals which should preferably have a low absorption coefficient in the vicinity of a visible range of light.

According to the present invention, as described above, since the first and second light shield films are disposed above and below the thin-film transistor for preventing light from reaching the thin-film transistor, incident light applied to the active-matrix substrate and light reflected by a lens of an optical system are prevented from reaching the thin-film transistor.

Consequently, the OFF current which is generated by the thin-film transistor due to light excitation is prevented from increasing, and hence the quality of an image displayed by the light-crystal display device is revented from being lowered.

The face or reverse side of the active-matrix board may be oriented toward incident light, and the direction in which the active-matrix board is scanned may be changed simply by changing the orientation of the active-matrix board. Therefore, no special circuit is required when the direction of scan is reversed, and hence the active-matrix board may be used with a projection- or reflection-type display unit.

While a preferred embodiment of the present invention has been described using specific terms, such description is for illustrative purposes only, and it is to be understood that changes and variations may be made without departing from the spirit or scope of the following claims.

What is claimed is:

1. An active-matrix board comprising:
   a transparent insulating substrate with scanning and signal lines thereon;
   a thin-film transistor disposed on a face side of said transparent insulating substrate;
   a first light shield film disposed on said thin-film transistor, for blocking light applied toward the thin-film transistor; and
   a second light shield film disposed on a reverse side of said transparent insulating substrate and positioned across the transparent insulating substrate from said first light shield film, for blocking light applied toward the thin-film transistor;
   said reverse side of said transparent insulating substrate having a roughened surface where said second light shield film is disposed.

2. An active-matrix board according to claim 1, wherein said roughened surface is opaque.

3. An active-matrix board according to claim 2, wherein each of said first light shield film and said second light shield film is made of aluminum.

4. An active-matrix board according to claim 2, wherein each said thin-film transistor comprises a planar thin-film transistor.

5. An active-matrix board according to claim 2, wherein each said thin-film transistor comprises a staggered thin-film transistor.

6. An active-matrix board according to claim 1, wherein each of said first light shield film and said second light shield film is made of aluminum.

7. An active-matrix board according to claim 6, wherein each said thin-film transistor comprises a planar thin-film transistor.

8. An active-matrix board according to claim 6, wherein each said thin-film transistor comprises a staggered thin-film transistor.

9. An active-matrix board according to claim 1, wherein said thin-film transistor comprises a planar thin-film transistor.

10. An active-matrix board according to claim 9, wherein each said thin-film transistor comprises a planar thin-film transistor.

11. An active-matrix board according to claim 9, wherein each said thin-film transistor comprises a staggered thin-film transistor.

12. An active-matrix board according to claim 1, wherein said thin-film transistor comprises a staggered thin-film transistor.

13. An active-matrix board according to claim 12, wherein each said thin-film transistor comprises a planar thin-film transistor.

14. An active-matrix board according to claim 12, wherein each said thin-film transistor comprises a staggered thin-film transistor.

15. An active-matrix board according to claim 1, wherein each of said first light shield film and said second light shield film is made of aluminum.

16. An active-matrix board according to claim 1, wherein each said thin-film transistor comprises a planar thin-film transistor.

17. An active-matrix board according to claim 1, wherein each said thin-film transistor comprises a staggered thin-film transistor.

18. An active-matrix board comprising:

a transparent insulating substrate with scanning and signal lines thereon;

a thin-film transistor disposed on a face side of said transparent insulating substrate;

a first light shield film disposed on said thin-film transistor, for blocking light applied toward the thin-film transistor; and a second light shield film disposed on a reverse side of said transparent insulating substrate and positioned across the transparent insulating substrate from said first light shield film, for blocking light applied toward the thin-film transistor;

said transparent insulating substrate having an opaque portion where said second light shield film is disposed.

19. An active-matrix board according to claim 18, wherein each of said first light shield film and said second light shield film is made of aluminum.

20. An active-matrix board according to claim 18, wherein each said thin-film transistor comprises a planar thin-film transistor.

21. An active-matrix board according to claim 18, wherein each said thin-film transistor comprises a staggered thin-film transistor.

* * * * *